United States Patent
Kashihara et al.

(10) Patent No.: US 7,390,442 B2
(45) Date of Patent: Jun. 24, 2008

(54) ANISOTROPIC CONDUCTIVE FILM AND METHOD FOR PRODUCING THE SAME

(75) Inventors: Hideki Kashihara, Osaka (JP); Masamichi Yamamoto, Osaka (JP); Jun Yorita, Hyogo (JP); Hideaki Toshioka, Osaka (JP); Misako Osoegawa, Osaka (JP); Keiji Koyama, Osaka (JP); Masatoshi Majima, Osaka (JP); Yoshie Tani, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 207 days.

(21) Appl. No.: 10/506,425

(22) PCT Filed: Mar. 3, 2003

(86) PCT No.: PCT/JP03/02411
§ 371 (c)(1), (2), (4) Date: Sep. 2, 2004

(87) PCT Pub. No.: WO03/075409
PCT Pub. Date: Sep. 12, 2003

(65) Prior Publication Data
US 2005/0106382 A1    May 19, 2005

(30) Foreign Application Priority Data
Mar. 4, 2002 (JP) .............................. 2002-057598
Nov. 7, 2002 (JP) .............................. 2002-324311

(51) Int. Cl.
*H01B 1/02* (2006.01)
*H01B 1/22* (2006.01)

(52) U.S. Cl. .................. 252/512; 252/513; 252/514
(58) Field of Classification Search ................ 252/500, 252/512, 513, 514; 205/261, 269, 270, 271
See application file for complete search history.

(56) References Cited

U.S. PATENT DOCUMENTS 4,548,862 A    10/1985    Hartman (Continued)

FOREIGN PATENT DOCUMENTS

EP    0 302 631 A1    2/1989

(Continued)

*Primary Examiner*—Mark Kopec
*Assistant Examiner*—Jaison Thomas
(74) *Attorney, Agent, or Firm*—McDermott Will & Emery LLP

(57) ABSTRACT

An anisotropic conductive film, and its production method, especially suitable for mounting a semiconductor package and sufficiently satisfying the requirements of higher density mounting because short circuit does not occur in the plane direction of the film even if the pitch of electrodes is small, or suitable for mounting a contact probe because conductive connection not fused with a high current can be ensured with a lower pressure and even a high frequency signal can be dealt with. The anisotropic conductive film contains metal powder having such a shape that many fine metal particles are linked as a conductive component, wherein the length of the chain of metal powder is set not longer than the distance between adjacent electrodes being bonded conductively when a semiconductor package is mounted, and the diameter of the chain is set in the range of 1 μm-20 μm when a contact probe is mounted. At least a part of the film is formed while orienting a chain formed of a paramagnetic metal with a magnetic field.

32 Claims, 1 Drawing Sheet

U.S. PATENT DOCUMENTS

| | | |
|---|---|---|
| 4,902,857 A | 2/1990 | Cranston et al. |
| 4,923,739 A * | 5/1990 | Jin et al. ............... 428/221 |
| 5,769,996 A | 6/1998 | McArdle et al. |
| 5,785,897 A | 7/1998 | Atsushi et al. |
| 6,190,509 B1 | 2/2001 | Haba |
| 6,217,349 B1 | 4/2001 | Konno |
| 6,238,599 B1 * | 5/2001 | Gelorme et al. ........ 252/514 |
| 6,620,344 B2 * | 9/2003 | Sano et al. ............. 252/512 |
| 2002/0047108 A1 | 4/2002 | Yukinobu et al. |
| 2003/0205404 A1 | 11/2003 | Hara et al. |

FOREIGN PATENT DOCUMENTS

| | | |
|---|---|---|
| EP | 1 315 241 A1 | 5/2003 |
| JP | 55-159578 | 12/1980 |
| JP | 62-186413 | 8/1987 |
| JP | 64-052303 | 2/1989 |
| JP | 64-054609 | 3/1989 |
| JP | 02-005376 | 1/1990 |
| JP | 4-88104 | 3/1992 |
| JP | 4-088104 | 3/1992 |
| JP | 6-102523 | 4/1994 |
| JP | 6-115617 | 5/1996 |
| JP | 08-273431 | * 10/1996 |
| JP | 08-315883 | 11/1996 |
| JP | 11-134935 | 5/1999 |
| JP | 2000-124662 | * 4/2000 |
| JP | 2000-124662 A | 4/2000 |
| JP | 2000-357414 A | 12/2000 |
| JP | 2001-351445 A | 12/2001 |
| JP | 2002-038053 A | 2/2002 |

* cited by examiner

ANISOTROPIC CONDUCTIVE FILM AND METHOD FOR PRODUCING THE SAME

TECHNICAL FIELD

The present invention relates to a new anisotropic conductive film used for electronics mounting, and a method of producing the same.

BACKGROUND ART

One of the methods of electronics mounting for mounting a semiconductor package on a printed circuit board, or electrically connecting respective conductor circuits on two printed circuit boards to each other and coupling or fixing both the printed circuit boards to each other is a method using a film-shaped anisotropic conductive film (see, Japanese Laid Opened Patent Publication Nos. JP-H06-102523-A2 (1994), JP-H08-115617-A2 (1996), etc.).

When a semiconductor package is mounted, a semiconductor package having a plurality of bumps arranged on its mounting surface to a printed circuit board to form a connecting portion, and a printed circuit board having a plurality of electrodes arranged with the same pitch as the pitch of the bumps in its region where the semiconductor package is mounted to form a connecting portion are prepared, and the semiconductor package and the printed circuit board are thermally bonded in a state where the connecting portions are opposed to each other and an anisotropic conductive film is interposed therebetween while being aligned with each other such that the bump and the electrode, in each of pairs, in both the connecting portions are overlapped with each other in the plane direction of the film.

When printed circuit boards are connected to each other, two printed circuit boards respectively having pluralities of electrodes arranged therein with the same pitch at their connecting positions to form connecting portions are prepared, and are thermally bonded in a state where the connecting portions are opposed to each other and an anisotropic conductive film is interposed therebetween while being aligned with each other such that the respective electrodes, in each of pairs, in both the connecting portions are overlapped with each other in the plane direction of the film.

The anisotropic conductive film generally has a structure in which a powdered conductive component is dispersed in a film having heat-sensitive adhesive properties including a binding agent such as thermoplastic resin or curable resin.

In the anisotropic conductive film, in order to prevent the occurrence of such short circuit in the plane direction of the film that the bump and the electrode or the electrode and the electrode, in each of the pairs, which are arranged with each other in the plane direction of the film are short-circuited with the bump and the electrode or the electrode and the electrode in the adjacent pair, a filling factor, found by the following equation (1), of the conductive component such that a conductive resistance in the plane direction (referred to as an "insulating resistance") is increased:

$$\text{filling factor (vol. \%)} = \frac{\text{(volume of conductive component)}}{\text{(total volume of solid contents)}} \times 100 \quad (1)$$

In a case where the film is formed by the conductive component and the binding agent as solid contents, as described above, the total volume of the solid contents in the equation is the total of both the volumes of the conductive component and the binding agent.

The anisotropic conductive film is compressed in the thickness direction by heating and pressurization at the time of thermal bonding, so that the filling factor of the conductive component in the thickness direction is increased, and the conductive components are brought in close proximity to or into contact with each other to form a conductive network. As a result, a conductive resistance in the thickness direction (referred to as a "connecting resistance") is reduced. In this case, however, the filling factor of the conductive component in the plane direction of the anisotropic conductive film is not increased. Therefore, the plane direction maintains an initial state where the insulating resistance is high and the conductivity is low.

Thus, the anisotropic conductive film has anisotropic conductive properties in which the connecting resistance in the thickness direction is low and the insulating resistance in the plane direction is high. The anisotropic conductive film allows, while preventing the above-mentioned short circuit in the plane direction of the film from occurring, to maintain an electrically independent state for each of the bump-electrode pairs or the electrode-electrode pairs, the bumps and the electrodes or the electrodes and the electrodes in all the pairs, which are respectively arranged with each other in the plane direction of the film, to be simultaneously conductively connected to each other.

In addition thereto, the heat-sensitive adhesive properties of the film allows the semiconductor package to be fixed on the printed circuit board by thermal bonding or the printed circuit boards to be fixed to each other by thermal bonding.

The use of the anisotropic conductive film makes it easy to perform work for electronics mounting.

Various types of metal powders such as an Ni powder having an average particle diameter of several to several tens of micrometers and having a granular shape, a spherical shape, or a foil shape (a scale shape, a flake shape), resin powder whose surface is gold-plated, and so on are put to practical use as a conductive component included in the conventional anisotropic conductive film.

The conventional anisotropic conductive film generally contains the above-mentioned metal powder such that the filling factor found in the foregoing equation (1) is 7 to 10% by volume.

In the range of the filling factor, however, the value of the connecting resistance in the thickness direction after thermal bonding is not sufficient, so that the number of cases where it is required that the connecting resistance should be made much lower is increasing.

Therefore, it is considered that the filling factor of the metal powder serving as a conductive component is made higher than that in the above-mentioned range in order to further make the connecting resistance in the thickness direction lower than before.

In such a case, however, in the conventional anisotropic conductive film using the above-mentioned general metal powder, the insulating resistance in the plane direction of the film is also reduced, so that short circuit in the plane direction of the film easily occurs.

Since such a problem easily occurs, the conventional anisotropic conductive film cannot cope with the above-mentioned requirements unless the pitch of the adjacent bumps or electrodes composing the connecting portion is not less than 50 µm. In the present circumstances, the conventional anisotropic conductive film cannot cope with requirements of higher density mounting in the field of electronics mounting.

In recent years, the inventors have examined that in a probe card used for examining whether or not a semiconductor package chip such as a memory, an IC, an LSI (Large Scale Integrated Circuit), or an ASIC (Application Specific Integrated Circuit) is normally manufactured, one anisotropic conductive film is used in place of a lot of wirings used for respectively connecting a lot of fine contact probes mounted on a mounting substrate to electrodes provided on a circuit in a probe card main body. The inventors have considered that in such connection, the mounting pitch of the contact probes is approximately 100 to 200 μm in correspondence with the pitch of pads in the semiconductor package chip and therefore, even the conventional anisotropic conductive film can cope with the above-mentioned requirements.

That is, the probe card serves to achieve conduction by pressing the contact probe against the pad on the semiconductor package chip which has not been cut to a predetermined size, formed on a wafer, thereby connecting a circuit in the semiconductor package chip to an external examination circuit through the circuit in the probe card main body to examine the circuit. However, as the semiconductor package chip is miniaturized and highly integrated, the pad itself or the formation pitch thereof is miniaturized, or the number of pads is increased, the contact probe itself tends to be refined or highly integrated on the mounting substrate.

Particularly in recent years, a probe card in which a lot of very fine contact probes processed with a processing accuracy in micron units are mounted on a mounting substrate with the same pitch of 100 to 200 μm as the pitch of the pads in the semiconductor package chip, as described above, has been put to practical use.

In the probe card for examining several tens to several hundreds of semiconductor package chips formed on one wafer, however, several thousands of contact probes must be mounted on the mounting substrate. The number of wirings for connecting the contact probes and the probe card main body must be also the same as the number of contact probes. Therefore, the number of times of soldering of the wirings becomes enormous.

Therefore, the manufacture of the probe card and the management thereof at the time of use are significantly difficult.

Therefore, the inventors have examined that a lot of wirings and their soldering are replaced with one anisotropic conductive film. Even if the conventional anisotropic conductive film is simply used for another purpose, however, the following problems occur. Therefore, it has been found that practical applications thereof are difficult.

(i) When an internal circuit in a semiconductor package chip to be tested is short-circuited, a large current of not less than 1 A, may flow locally through the anisotropic conductive film at the time of the test. However, the conventional anisotropic conductive film does not consider response to such a large current. A current value to be allowed is only several ten milliamperes. When a large current flows by short circuit or the like, therefore, Joule heat is produced so that the temperature of the anisotropic conductive film locally rises. Therefore, the anisotropic conductive film may be fused.

(ii) The contact probe is very small and is liable to be destroyed, as described above. When the anisotropic conductive film is used for mounting the contact probe, that is, connection to an electrode, therefore, pressurization at the time of thermal bonding must be performed at a lower pressure, as compared with that in the case of the above-mentioned normal connection between the bump and the electrode or between the electrodes. When the contact probe and the electrode are connected to each other at a low pressure, however, a connecting resistance in the thickness direction cannot be reduced to a sufficiently practical level, which may cause inferior connection in the conventional anisotropic conductive film.

(iii) When the filling factor of a metal powder is increased in order to eliminate the inferior conduction, the insulating resistance in the plane direction is also reduced in the conventional anisotropic conductive film. Even if the pitch is 100 to 200 μm, the above-mentioned short circuit in the plane direction of the film, that is, short circuit between the contact probe and the electrode, in each of the pairs, which are arranged with each other in the plane direction of the film in this case, and the contact probe and the electrode in the adjacent pair may occur.

(iv) In order to examine a semiconductor package chip for a graphic board or a computer game and a high-speed semiconductor package chip such as a Ga—As device, at an operation speed actually used, a high-frequency signal must be used. When the filling factor of the metal powder is increased to eliminate the inferior conduction as in the item (iii), however, it is difficult to pass the high-frequency signal because the impedance of the anisotropic conductive film is increased, so that the anisotropic conductive film may be unable to be examined.

(v) The semiconductor package chip to be examined by the probe card is distributed over the whole surface of one wafer in many cases, as described above. Therefore, the substrate on which the contact probe is mounted and the probe card main body are formed to such large sizes as to cover the wafer. Consequently, the anisotropic conductive film for connecting the probe card must cover a significantly larger size than that for the conventional semiconductor mounting. Moreover, at the time of the above-mentioned connection at a low pressure, variations in the thickness direction such as warping of the large members must be absorbed over the whole surface, not to cause inferior connection, inferior conduction, and so on. However, it is difficult for the conventional anisotropic conductive film to cope with such requirements.

DISCLOSURE OF THE INVENTION

A primary object of the present invention is to provide a new anisotropic conductive film capable of sufficiently coping with requirements of higher density mounting particularly for mounting a semiconductor package or the like because there occurs no short circuit in the plane direction of the film even if the pitch of adjacent bumps or electrodes composing a connecting portion is less than 50 μm and more preferably not more than 40 μm.

Another object of the present invention is to provide a new anisotropic conductive film particularly suitable for mounting of a contact probe or the like because it can make conductive connection more reliably by connection at a lower pressure than that in the above-mentioned case of mounting a semiconductor package, is not fused even if a large current flows, and can also cope with a high-frequency signal.

Still another object of the present invention is to provide a method of producing such a new anisotropic conductive film.

An anisotropic conductive film according to the present invention is characterized in that it contains a metal powder having the form of a lot of fine metal particles being linked in a chain shape and in which the ratio L/D of the length L to the diameter D of the chain is not less than 3, is contained as a conductive component.

The metal powder used as the conductive component in the present invention is formed in the form of a lot of fine metal particles on the order of microns to the order of sub-microns being linked in a chain shape from the beginning by a reduction and deposition method, described later. As particularly described later, in a metal powder having a structure in which a metal film is further deposited around a lot of metal particles linked to each other, the metal particles are directly connected to each other. The increase in contact resistance between the metal particles is restrained, as compared with that in a set of conventional metal powders in a granular shape or the like, thereby allowing the conductive properties of the metal powder itself to be improved.

The specific surface area of the above-mentioned chain-shaped metal powder is larger than that of the conventional metal powder in a granular shape or the like. Accordingly, the metal powders can be also uniformly dispersed in the binding agent without aggregating.

Moreover, in the chain-shaped metal powder, the ratio of the diameter D to the length L of the chain is not less than 3, as described above, and is preferably as high as approximately 10 to 100. Even if the metal powder is added in a small amount, a network having good conductive properties can be formed in the anisotropic conductive film.

In the anisotropic conductive film according to the present invention, therefore, the connecting resistance in the thickness direction can be made significantly lower than before without making the filling factor of the metal powder very high, that is, while maintaining the insulating resistance in the plane direction of the anisotropic conductive film at a high level.

In a case where the anisotropic conductive film according to the present invention is used for mounting a semiconductor package, even if the semiconductor package is a fine component in which the pitch of adjacent bumps or electrodes composing a connecting portion is less than 50 μm and more preferably not more than 40 μm, conductive connection can be made reliably without causing short circuit in the plane direction of the film, described above, thereby making it possible to sufficiently cope with requirements of higher density mounting.

In a case where the anisotropic conductive film according to the present invention is used for mounting a contact probe, a lot of contact probes can be conductively connected more reliably by connection at a lower pressure without making the filling density of the metal powder very high, as described above, and therefore in a state where the impedance is maintained at a low level to allow the passage of a high-frequency signal.

In the present invention, it is preferable that the chain of the metal powder is oriented in the thickness direction of the film.

When the chain of the metal powder is oriented in the thickness direction of the film, the connecting resistance in the thickness direction can be more significantly reduced.

It is preferable that the chain-shaped metal powder or each of the metal particles forming the metal powder is formed of
 a metal having ferromagnetism,
 an alloy of two or more types of metals having ferromagnetism,
 an alloy of a metal having ferromagnetism and another metal, or
 a complex containing a metal having ferromagnetism.

In the above-mentioned configuration, if the fine metal particles on the order of submicrons are deposited by a reduction and deposition method, described later, the metal particles are made magnetic. A lot of metal particles are linked in a chain shape by a magnetic force so that the chain-shaped metal powder is automatically formed.

Accordingly, the chain-shaped metal powder is easy to produce, thereby making it possible to improve the production efficiency of the anisotropic conductive film and reduce the cost thereof.

Examples of the metal powder include ones having various structures from one in which a lot of fine metal particles are linked in a chain shape merely by a magnetic force, as described above, to one in which a metal layer is further deposited around linked metal particles so that the metal particles are tightly bonded to one another. In either one of them, however, the metal particles basically hold a magnetic force.

Therefore, the chain is not easily cut even by the degree of stress created in producing the composite material or in applying the composite material on a base to form the anisotropic conductive film. Even if the chain is cut, the chain is recombined, at the time point where the stress is not applied. Moreover, in a coating film after the application, a plurality of metal powders are brought into contact with one another on the basis of a magnetic force of the metal particles so that a conductive network is easily formed.

Consequently, the connecting resistance in the thickness direction of the anisotropic conductive film can be also made lower.

It is preferable that the whole of the metal powder formed of a metal having ferromagnetism, an alloy of two or more types of metals having ferromagnetism, or an alloy of a metal having ferromagnetism and another metal out of the foregoing metal powders or each of the metal particles, or
 a portion, of the metal powder formed of a complex containing the metal having ferromagnetism or each of the metal particles, containing the metal having ferromagnetism,
 is formed by being deposited in a solution containing a reducing agent by adding ions forming the metal having ferromagnetism which is its forming material to the solution.

Such a reduction and deposition method allows the chain-shaped metal powder to be automatically formed, as described above.

The respective particle diameters of the metal particles formed by the reduction and deposition method are uniform, and the particle diameter distribution is sharp. This is for reduction reaction to uniformly progress in a system. Consequently, the metal powder produced from the metal particles is superior in the effect of bringing the connecting resistance in the thickness direction of the anisotropic conductive film to a uniform state over the whole of the anisotropic conductive film.

It is preferable that a trivalent titanium compound is used as the reducing agent.

When the trivalent titanium compound such as titanium trichloride is used as the reducing agent, the solution obtained after the chain-shaped metal powder is formed by being deposited can be repeatedly regenerated to a state where it can be utilized for producing the chain-shaped metal powder by electrolytic regeneration.

When the anisotropic conductive film according to the present invention respectively contains a chain-shaped metal powder and a binding agent as solid contents, it is preferable that the filling factor of the metal powder found by the foregoing equation (1) is 0.05 to 20% by volume.

In a case where the filling factor is less than 0.05% by volume, the amount of the metal powder that contributes to conduction in the thickness direction of the anisotropic conductive film is too small, so that the connecting resistance in the same direction after thermal bonding may be unable to be sufficiently reduced. On the other hand, when the filling factor exceeds 20% by volume, the insulating resistance in the plane direction of the anisotropic conductive film is too low so that short circuit in the plane direction of the film may easily occur.

It is preferable that used as the chain-shaped metal powder is one having the form of a lot of fine metal particles being linked in a straight-chain shape or a needle shape.

In a case where the straight-chain-shaped or needle-shaped metal powder is used, the connecting resistance in the thickness direction of the anisotropic conductive film can be further reduced, and the insulating resistance in the plane direction thereof can be further increased. Particularly in orienting the chain of the metal powder in the thickness direction of the film, an interaction between the metal powders arranged in the direction of orientation can be made stronger, and an interaction between the metal powders arranged in the transverse direction crossing the direction of orientation can be made weaker. Therefore, the above-mentioned effect produced by using the chain-shaped metal powder can be more significantly exhibited.

It is preferable that the length of the chain of the metal powder is less than the distance between adjacent electrodes, composing a connecting portion, conductively connected by using the anisotropic conductive film according to the present invention.

Particularly in a case where a semiconductor package is mounted, when the length of the chain of the metal powder is defined to less than the distance between the adjacent electrodes, as described above, adjacent bumps or electrodes are not short-circuited even if the chain-shaped metal powder falls sideways at the time of thermal bonding. This allows the occurrence of short circuit in the plane direction of the film to be reliably prevented.

It is preferable that in the chain of the metal powder in which the length of the chain is in the above-mentioned range, the diameter of the chain is not more than 1 μm.

If the diameter of the chain is within the above-mentioned range, particularly in a case where a semiconductor package is mounted, short circuit in the plane direction of the film does not occur by the effect of making an interaction between the metal powders strong or weak, as described above, even if the pitch of adjacent bumps or electrodes is less than 50 μm and more preferably not more than 40 μm.

In order to set the diameter of the chain to not more than 1 μm, it is preferable that the particle diameter of each of the metal particles forming the chain is not more than 400 nm.

Furthermore, in the above-mentioned metal powder, the ratio L/D of the length L to the diameter D of the chain must be not less than 3.

In a case where the ratio L/D is less than 3, the length of the chain is too small, so that the effect of reducing the contact resistance of the anisotropic conductive film without causing short circuit in the plane direction of the film is not obtained by the effect of making an interaction between the metal powders strong or weak, as described above.

In the mounting of a semiconductor package, considering that the connecting resistance in the thickness direction of the anisotropic conductive film by thermal bonding is made sufficiently low, it is preferable that the chain-shaped metal powder is formed of a complex of a chain formed of a metal having ferromagnetism, an alloy of two or more types of metals having ferromagnetism, an alloy of a metal having ferromagnetism and another metal, or a complex containing a metal having ferromagnetism and at least one metal, with which a surface of the chain is coated, selected from a group consisting of Cu, Rb, Rh, Pd, Ag, Re, Pt, and Au.

On the other hand, in the mounting of a contact probe, considering that a large current is caused to flow while preventing short circuit in the plane direction of the film and suppressing the impedance level to a low level to allow the passage of a high-frequency signal, it is preferable that the diameter of the chain of each of the metal powders is set in a range exceeding 1 μm larger than that in the above-mentioned case, and each of the chains is oriented in the thickness direction of the film such that there occurs no short circuit in the plane direction of the film.

Even if the pitch of the adjacent contact probes or electrodes is 100 to 200 μm, as described above, it is preferable that the diameter of the chain of the metal powder is not more than 20 μm in order to package the contact probes without causing short circuit in the plane direction of the film by the effect of making an interaction between the metal powders strong or weak, as described above.

In the mounting of a contact probe, it is preferable that the filling factor of the metal powder is 0.05 to 5% by volume in order to restrain the rise in impedance to allow the passage of a high-frequency signal.

Furthermore, in the mounting of a contact probe, considering that the connecting resistance at the time of connection at a low pressure is further reduced, it is preferable that the chain-shaped metal powder is formed of a complex of a chain formed of a metal having ferromagnetism, an alloy of two or more types of metals having ferromagnetism, an alloy of a metal having ferromagnetism and another metal, or a complex containing a metal having ferromagnetism and at least one metal, with which a surface of the chain is coated, selected from a group consisting of Cu, Rb, Rh, Pd, Ag, Re, Pt, and Au.

Out of the anisotropic conductive films according to the present invention, one in which the chain-shaped metal powder is oriented in the thickness direction of the film can be produced by:

(1) a method comprising the steps of applying a composite material, having fluidity, containing a chain-shaped metal powder formed of a metal at least a part of which has ferromagnetism and a binding agent on a base to which a magnetic field is applied in a direction crossing a surface of the base, to orient the chain of the metal powder in the composite material in the thickness direction of the film along the direction of the magnetic field, and solidifying or curing the composite material to fix the orientation of the chain, or (II) a method comprising the steps of spraying a chain-shaped metal powder formed of a metal at least a part of which has ferromagnetism on a base to which a magnetic field is applied in a direction crossing a surface of the base, to orient the chain of the metal powder in the direction of the magnetic field, and applying thereon a coating agent, having fluidity, containing a binding agent, and solidifying or curing the coating agent to fix the orientation of the chain.

According to the producing methods, the anisotropic conductive film in which the chain of the metal powder is oriented in the thickness direction of the film can be produced more efficiently.

BEST MODE FOR CARRYING OUT THE INVENTION

The present invention will be described.

An anisotropic conductive film according to the present invention is characterized in that it contains a metal powder having the form of a lot of fine metal particles being linked in a chain shape as a conductive component.

(Metal Powder)

Usable as the chain-shaped metal powder is any of various metal powders respectively produced by various types of methods such as a vapor phase method and a liquid phase method and having chain structures. It is preferable that a lot of fine metal particles are connected to one another in a straight-chain shape or a needle shape.

It is preferable that as the chain-shaped metal powder, the metal powder or each of the metal particles forming the metal powder is formed of a metal having ferromagnetism, an alloy of two or more types of metals having ferromagnetism, an alloy of a metal having ferromagnetism and another metal, or a complex containing a metal having ferromagnetism.

Specific examples of the metal powder containing the metal having ferromagnetism include any one of the following types of metal powders (a) to (f) or a mixture of two or more types of metal powders.

Figure 1A:
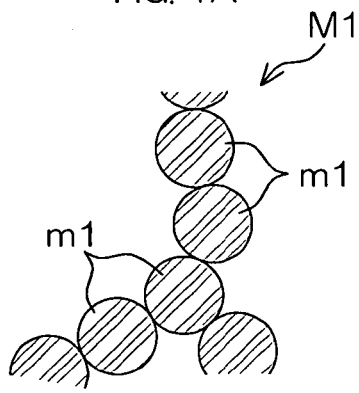
FIGS. 1A to 1F are cross-sectional views each showing an example of a chain-shaped metal powder contained as a conductive paste in an anisotropic conductive film according to the present invention in partially enlarged fashion.

(a) A metal powder M1 obtained by linking a lot of metal particles m1 on the order of sub-microns, formed of a metal having ferromagnetism, an alloy of two or more types of metals having ferromagnetism, or an alloy of a metal having ferromagnetism and another metal, in a chain shape by its own magnetism, as illustrated in partially enlarged fashion in FIG. 1A.

Figure 1B:
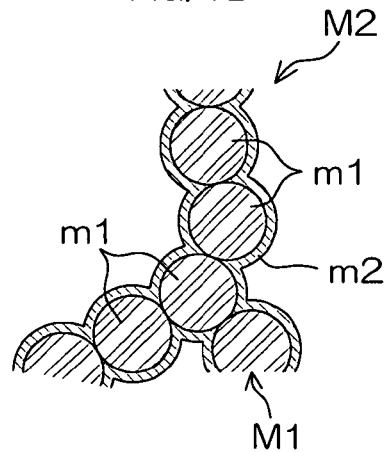

(b) A metal powder M2 obtained by further depositing a metal layer m2 composed of a metal having ferromagnetism, an alloy of two or more types of metals having ferromagnetism, or an alloy of a metal having ferromagnetism and another metal on a surface of the metal powder M1 in the foregoing item (a), to tightly bond metal particles to one another, as illustrated in partially enlarged fashion in FIG. 1B.

Figure 1C:
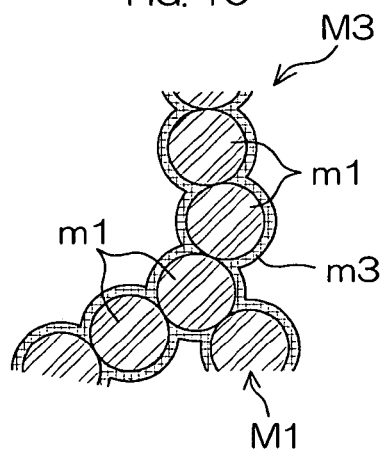

(c) A metal powder M3 obtained by further depositing a metal layer m3 composed of the other metal such as Ag, Cu, Al, Au, or Rh or an alloy on the surface of the metal powder M1 in the foregoing item (a), to tightly bond metal particles to one another, as illustrated in partially enlarged fashion in FIG. 1C.

Figure 1D:
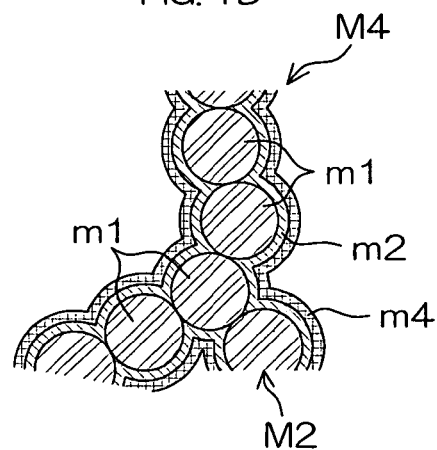

(d) A metal powder M4 obtained by further depositing a metal layer m4 composed of the other metal such as Ag, Cu, Al, Au, or Rh or an alloy on a surface of the metal powder M2 in the foregoing item (b), to tightly bond the metal particles to one another, as illustrated in partially enlarged fashion in FIG. 1D.

Figure 1E:
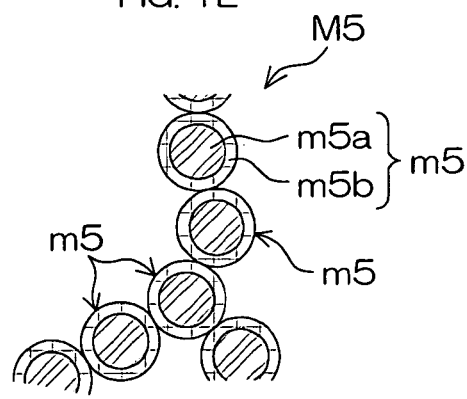

(e) A metal powder M5 obtained by coating a surface of a granular core material m5a formed of a metal having ferromagnetism, an alloy of two or more types of metals having ferromagnetism, or an alloy of a metal having ferromagnetism and another metal with a coating layer m5b composed of the other metal such as Ag, Cu, Al, Au, or Rh or an alloy to obtain a complex m5, and linking a lot of complexes m5 in a chain shape as metal particles by the magnetism of the core material m5a, as illustrated in partially enlarged fashion in FIG. 1E.

Figure 1F:
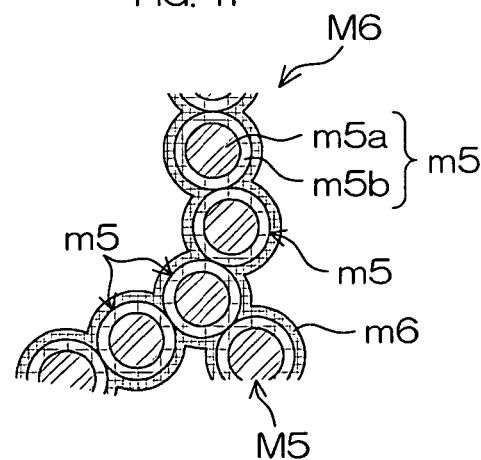

(f) A metal powder M6 obtained by further depositing a metal layer m6 composed of the other metal such as Ag, Cu, Al, Au, or Rh or an alloy on a surface of the metal powder M5 in the foregoing item (e), to tightly bond the metal particles to one another, as illustrated in partially enlarged fashion in FIG. 1F.

Although in the drawings, the metal layers m2, m3, m4, and m6 and the coating layer m5 are respectively described as single layers, each of the layers may have a laminated structure of two or more layers composed of the same metal material or different metal materials.

It is preferable that the whole of the metal powder formed of a metal having ferromagnetism, an alloy of two or more types of metals having ferromagnetism, or an alloy of a metal having ferromagnetism and another metal out of the foregoing metal powders or each of the metal particles, or a portion, of the metal powder or each of the metal particles formed of a complex containing a metal having ferromagnetism, containing the metal having ferromagnetism, is formed by being deposited in a solution containing ions forming a metal having ferromagnetism which is its forming material by adding a reducing agent to the solution by the reduction and deposition method.

In the reduction and deposition method, ammonia water or the like is added to a solution in which a trivalent titanium compound such as titanium trichloride serving as a reducing agent and sodium citrate or the like, are dissolved (hereinafter referred to as a "reducing agent solution") to adjust the pH thereof to 9 to 10. Consequently, trivalent titanium ions are bonded to a citric acid serving as a complexing agent to form a coordination compound, so that activation energy in the case of oxidation from Ti (III) to Ti (IV) is lowered, and a reduction potential is raised. Specifically, a potential difference between Ti (III) and Ti (IV) exceeds 1 V. This value is a significantly higher value, as compared with a reduction potential from Ni (II) to Ni (0) and a reduction potential from Fe (II) to Fe (0). Accordingly, it is possible to efficiently reduce ions forming various types of metals, to deposit and form metal particles, metal films, and so on.

A solution containing ions forming a metal having ferromagnetism such as Ni or a solution containing two or more types of ions forming an alloy containing a metal having ferromagnetism is then added to the above-mentioned reducing agent solution.

Consequently, Ti (III) functions as a reducing agent, to reduce metal ions and deposit the reduced metal in the solution when itself is oxidized to Ti (IV). That is, metal particles composed of the above-mentioned metal or alloy are deposited in the solution, and a lot of metal particles are linked in a chain shape by their own magnetism, to form a chain-shaped metal powder. When the deposition is further continued after that, a metal layer is further deposited on a surface of the metal powder, thereby tightly bonding the metal particles.

That is, the metal powders M1 and M2 in the foregoing items (a) and (b) and the metal particles m1 which are the original form of the metal powders, the core materials m5a in the complexes m5 which are the original form of the metal powders M5 and M6 in the foregoing items (e) and (f), and so on can be produced by the above-mentioned method.

The respective particle diameters of the metal particles m1 or the core materials m5a are uniform, and the particle diameter distribution is sharp. The reason for this is that reduction reaction uniformly progresses in the reaction system. Consequently, any of the metal powders M1 to M6 produced from the metal particles m1 or the core materials m5a is superior in the effect of bringing the conductive resistance in the thickness direction of the anisotropic conductive film into a uniform state over the whole surface of the anisotropic conductive film.

The reducing agent solution obtained after the metal particles, the core materials, or the like are deposited can be utilized for producing the chain-shaped metal powder by the reduction and deposition method repeatedly any number of times by performing electrolytic regeneration. That is, if the reducing agent solution obtained after the metal particles, the core materials, or the like are deposited is put in an electrolytic cell to reduce Ti (IV) to Ti (III) by applying a voltage, it can be employed as a reducing agent solution for electrolytic deposition again. This is because titanium ions are hardly consumed at the time of electrolytic deposition, that is, titanium ions, together with a metal to be deposited, are not deposited.

Examples of a metal or an alloy having ferromagnetism forming the metal particles, the core materials, or the like include Ni, Fe, Co, and an alloy of two or more types of the metals. Particularly, Ni, a Ni—Fe alloy (Permalloy), and so on are preferable. Particularly metal particles formed of such a metal or alloy are strong in magnetic interaction in a case where they are linked in a chain shape and therefore, are superior in the effect of reducing contact resistance between the metal particles.

Examples of other metals, together with the above-mentioned metal or alloy having ferromagnetism, forming the complexes in the foregoing items (c), (d), (e), and (f), include at least one type of metal selected from a group consisting of Cu, Rb, Rh, Pd, Ag, Re, Pt, and Au, and its alloy. When consideration is given to improvement in the conductive properties of the metal powder, it is preferable that a portion formed of the metal or metals is a portion exposed to an outer surface of the chain, as described in the foregoing items (c) to (f). A coating can be formed by various types of film forming methods such as an electroless plating method, an electroplating method, a reduction and deposition method, and a vacuum deposition method.

Preferable as a metal powder used for mounting a semiconductor package is one which has the structure as described in any of the foregoing items (a) to (f) and in which the length of the chain is less than the distance between adjacent electrodes, composing a connecting portion, conductively connected by using an anisotropic conductive film.

Preferable as the above-mentioned metal powder is one in which the diameter of its chain is not more than 1 μm, and the particle diameter of each of the metal particles forming the chain-shaped metal powder is not more than 400 nm.

The reason for this is as described above.

It is preferable that the length of the chain is not more than 0.9 times the distance between the adjacent electrodes, considering that short circuit occurring because the metal powder falls sideways is more reliably prevented.

If the diameter of the chain is too small, the chain is liable to be easily cut by the degree of stress in a case where the metal powder is mixed with a binding agent or a solvent to prepare a composite material or in a case where the composite material is applied over a base to produce an anisotropic conductive film. Therefore, the diameter of the chain is preferably not less than 10 nm.

If the particle diameter of metal particles forming the chain is too small, the size of the metal powder itself linked in a chain shape is too small, so that a function as a conductive component cannot be sufficiently obtained. Therefore, it is preferable that the particle diameter of the metal particles is not less than 10 nm.

The ratio L/D of the length L to the diameter D of the chain, which defines the lower limit of the length of the chain, must be not less than 3.

If the ratio L/D is less than 3, the shape of the chain comes closer to a granular shape than to a chain shape, so that the effect of lowering the contact resistance of the anisotropic conductive film without causing short circuit in the plane direction of the film is not obtained by the effect of making the interaction between the metal powders strong or weak, as also previously described.

A metal powder having a composite structure in which a surface of its chain is coated with at least one metal selected from a group consisting of Cu, Rb, Rh, Pd, Ag, Re, Pt, and Au, as described in the foregoing items (c) to (f), is preferable because the conductive properties thereof can be improved.

On the other hand, preferable as the metal powder used for mounting a contact probe is one which has a structure described in any of the items (a) to (f) and in which the diameter of its chain exceeds 1 μm and is not more than 20 μm.

It is preferable that the particle diameter of each of the metal particles forming the above-mentioned metal powder is 0.5 to 2 μm.

Particularly, a metal powder having a composite structure in which a surface of its chain is coated with at least one metal selected from a group consisting of Cu, Rb, Rh, Pd, Ag, Re, Pt, and Au, as described in the foregoing items (c) to (f), is preferable because the conductive properties thereof can be improved.

Also usable as the metal powder used for mounting a contact probe is one which has the form of a lot of chains having a smaller diameter and of the same degree as that used for mounting a semiconductor package aggregating in a bundle shape and in which the diameter of a chain obtained by the aggregation exceeds 1 μm and is not more than 20 μm. When consideration is given to improvement in conductive properties, a surface of such an aggregate may be coated with the above-mentioned metal.

There is an anisotropic conductive film having columnar Cu powders having a diameter of approximately 20 μm and a length of approximately 120 μm being dispersed in resin, which is similar in size to the above-mentioned metal powder.

When the anisotropic conductive film is used for mounting a contact probe, however, the conductive properties in the thickness direction of the film are insufficient, as apparent from the results in the comparative examples, described later. It is considered that the reason for this is that the metal powder cannot be magnetically oriented in the thickness direction of the film because it is a copper powder. That is, the copper powder cannot be oriented in the thickness direction of the film by application of a magnetic field, so that the copper powder is directed at random by stress at the time of film formation. Therefore, a sufficient conductive network cannot be formed in connection at a low pressure at the time of mounting a contact probe, so that the connecting resistance in the same direction cannot be sufficiently reduced.

(Binding Agent)

Usable as a binding agent, together with a chain-shaped metal powder, forming an anisotropic conductive film is any of various types of compounds conventionally known as a binding agent in the use and having film formation properties and adhesive properties. Examples of such a binding agent include thermoplastic resin, curable resin, and liquid curable resin. Particularly preferable examples include acrylic resin, epoxy resin, fluorocarbon resin, and phenolic resin.

(Composite Material)

A composite metal forming the basis of an anisotropic conductive film is produced by blending the chain-shaped metal powder and the binding agent, together with a suitable solvent, in a predetermined ratio. Further, the solvent may be omitted by using a liquid binding agent such as liquid curable resin.

(Anisotropic Conductive Film and Method of Producing the Same)

An anisotropic conductive film according to the present invention can be produced by applying the above-mentioned composite material over a base such as a glass plate, and drying or solidifying the composite material, or semi-curing, when a binding agent is curable resin or liquid curable resin, the composite material, and then stripping the composite material from the base.

When the anisotropic conductive film is used for mounting a semiconductor package, the thickness of the anisotropic conductive film is preferably 10 μm to 100 μm, considering that an electrode and a bump are conductively bonded to each other satisfactorily when they are pressed against each other through the anisotropic conductive film.

When the anisotropic conductive film is used for mounting a contact probe, the thickness of the anisotropic conductive film is preferably 100 μm to 300 μm, considering that variations in the thickness direction by warping or the like of a mounting substrate or a probe card main body are absorbed over the whole surface thereof, not to cause inferior connection, inferior conduction, or the like.

In the anisotropic conductive film according to the present invention, it is preferable that the chain of the metal powder is fixed in a state where it is oriented in the thickness direction of the film in either of the uses. Such an anisotropic conductive film can be produced by:

(A) applying a composite material, having fluidity, containing a chain-shaped metal powder formed of a metal at least a part of which has ferromagnetism and a binding agent, described above, over a base to which a magnetic field is applied in a direction crossing a surface of the base, to solidify or cure the composite material in a state where the chain of the metal powder is oriented in the thickness direction of the film along the direction of the magnetic field to fix the orientation of the chain of the metal powder, or (B) spraying a chain-shaped metal powder, described above, on a base to which a magnetic field is applied in a direction crossing a surface of the base, and applying a coating agent, having fluidity, including a binding agent in a state where a chain of the metal powder is oriented in the direction of the magnetic field, to solidify or cure the coating agent to fix the orientation of the chain of the metal powder, followed by stripping from the base.

It is preferable that the strength of the magnetic field applied in carrying out the methods is not less than 1000 μT, not less than 10000 μT among them, and particularly not less than 40000 μT in terms of a magnetic flux density, considering that the metal powder in the anisotropic conductive film is sufficiently oriented in the thickness direction of the film, although it differs depending on the type, the ratio, and so on of the metal having ferromagnetism included in the metal powder.

Examples of a method of applying a magnetic field include a method of arranging magnets on and under a base such as a glass substrate and a method utilizing a surface of a magnet as a base. The latter method utilizes the fact that a magnetic line of force extending from the surface of the magnet is approximately perpendicular to the surface of the magnet in a region from the surface to the degree of the thickness of the anisotropic conductive film and has the advantage that a device for producing the anisotropic conductive film can be simplified.

It is preferable that the filling factor of the metal powder found in the foregoing equation (1) in the anisotropic conductive film thus produced is 0.05 to 20% by volume.

Particularly when the anisotropic conductive film is used for mounting a contact probe, it is preferable that the filling factor of the metal powder is 0.05 to 5% by volume particularly in the above-mentioned range in order to restrain the rise in impedance to allow the passage of a high-frequency signal.

In order to adjust the filling factor in the above-mentioned range, when the chain-shaped metal power is not oriented, and in the case described in the foregoing method (A), the anisotropic conductive film may be formed using a composite material containing the metal powder and the binding agent in the above-mentioned ratio. On the other hand, in the case as described in the foregoing method (B), the amount of spraying of the metal powder, the concentration of the binding agent in the coating agent, the amount of application, and so on may be adjusted.

In the anisotropic conductive film according to the present invention, there occurs no short circuit in the plane direction of the film even if the pitch of the adjacent electrodes is less than 50 μm and more preferably not more than 40 μm in the mounting of a semiconductor package by the function of the chain-shaped metal powder serving as a conductive component. Therefore, it is possible to sufficiently cope with requirements of higher density mounting in the field of electronics mounting.

When the anisotropic conductive film is used for mounting a contact probe, conductive connection can be made more reliably by connection at a lower pressure than that in a case where a semiconductor package is mounted particularly by increasing the diameter of the chain as well as orienting the chain in the thickness direction of the film. Moreover, even if a large current flows, the anisotropic conductive film is not fused, and can cope with a high-frequency signal.

The anisotropic conductive film according to the present invention is also used for pin mounting in an IC socket in addition to the above-mentioned uses. Further, it can be also currently employed for a three-dimensional package which is wire-bonded or μ BGA (μ ball grid array) connected.

INDUSTRIAL APPLICABILITY

As described in the foregoing, the anisotropic conductive film according to the present invention can sufficiently cope with requirements of higher density mounting particularly for mounting a semiconductor package or the like because there occurs no short circuit in the plane direction of the film even if the pitch of adjacent electrodes is made smaller than that in the present circumstances. Another anisotropic conductive film according to the present invention is suitable particularly for mounting a contact probe or the like because conductive connection can be made more reliably by connection at a lower pressure than that in the above-mentioned case of mounting a semiconductor package and is not fused even if a large current flows therethrough, and can also cope with a high-frequency signal. Furthermore, a method of producing the anisotropic conductive film according to the present invention is suited to produce the above-mentioned anisotropic conductive film.

EXAMPLES

The present invention will be described on the basis examples and comparative examples.

[Anisotropic Conductive Film for Mounting Semiconductor Package]

Example 1

Used as a conductive component was an Ni powder, which has the form of fine Ni particles being linked in a straight-chain shape and in which the particle diameter of the Ni particles is 100 nm, the diameter D and the length L of the chain are respectively 400 nm and 5 μm, and the ratio L/D is 12.5.

The Ni powder and acrylic resin serving as a binding agent were mixed such that the filling factor of the Ni powder found in the foregoing equation (1) would be 20% by volume, and methyl ethyl ketone was added to a mixture, to prepare a paste-shaped composite material.

The composite material was then applied over a glass substrate, was dried or solidified, and was then stripped, to produce an anisotropic conductive film having a thickness of 30 µm.

Example 2

An anisotropic conductive film having a thickness of 30 µm was produced in the same manner as that in the example 1 except that an Ni powder, which has the form of fine Ni particles being linked in a straight-chain shape and in which the particle diameter of the Ni particles is 400 nm, the diameter D and the length L of the chain are respectively 1 µm and 5 µm, and the ratio L/D is 5, was used as a conductive component, the Ni powder and acrylic resin serving as a binding agent were mixed such that the filling factor of the Ni powder would be 0.05% by volume, and methyl ethyl ketone was added to a mixture, to prepare a paste-shaped composite material.

Example 3

An anisotropic conductive film having a thickness of 30 µm was produced in the same manner as that in the example 1 except that a metal powder having a composite structure in which a surface of an Ni powder, which has the form of fine Ni particles being linked in a straight-chain shape and in which the particle diameter of the Ni particles is 300 nm, the diameter D and the length L of the chain are respectively 600 nm and 5 µm, and the ratio L/D is 8.3, is coated with Ag having a thickness of 50 nm was used, and the metal powder and acrylic resin serving as a binding agent were mixed such that the filling factor of the metal powder would be 1% by volume, and methyl ethyl ketone was added to a mixture, to prepare a paste-shaped composite material.

Example 4

The same composite material as that prepared in the foregoing example 3 was applied over a magnet serving as a base, was dried or solidified in a magnetic field with a magnetic flux density of 40000 µT and therefore, was fixed in a state where a metal powder was oriented in the thickness direction of the film, followed by stripping, to produce an anisotropic conductive film having a thickness of 30 µm.

Example 5

The same metal powder as that used in the example 3 was sprayed on the same magnet as that used in the example 4, and was oriented in the thickness direction of the film in a magnetic field with a magnetic flux density of 40000 µT.

In this state, a coating agent obtained by dissolving acrylic resin serving as a binding agent in methyl ethyl ketone was then applied. The amount of the application was adjusted such that the filling factor of the metal powder would be 1% by volume.

The coating agent was dried or solidified and therefore, was fixed in a state where the metal powder was oriented in the thickness direction of the film, followed by stripping, to produce an anisotropic conductive film having a thickness of 30 µm.

Comparative Example 1

An anisotropic conductive film having a thickness of 30 µm was produced in the same manner as that in the example 1 except that a flake-shaped Ni powder with a particle diameter distribution from 5 µm to 20 µm was used, the Ni powder and acrylic resin serving as a binding agent were mixed such that the filling factor of the Ni powder would be 20% by volume, and methyl ethyl ketone was added to a mixture, to prepare a paste-shaped composite material.

Comparative Example 2

An anisotropic conductive film having a thickness of 30 µm was produced in the same manner as that in the example 1 except that a spherical metal powder having a composite structure in which a surface of spherical resin particles having a diameter of 5 µm is coated with Au having a thickness of 100 nm was used as a conductive component, the metal powder and acrylic resin serving as a binding agent were mixed such that the filling factor of the metal powder would be 20% by volume, and methyl ethyl ketone was added to a mixture, to prepare a paste-shaped composite material.

Comparative Example 3

An anisotropic conductive film having a thickness of 30 µm was produced in the same manner as that in the comparative example 2 except that the same metal powder as that used in the comparative example 2 and acrylic resin serving as a binding agent were mixed such that the filling factor of the metal powder would be 1% by volume, and methyl ethyl ketone was added to a mixture, to prepare a paste-shaped composite material.

Measurement of Connecting Resistance

The anisotropic conductive film produced in each of the examples and the comparative examples was affixed, on a flexible printed circuit board (FPC) having an electrode pattern in which Au electrodes having a width of 15 µm, a length of 50 µm, and a thickness of 2 µm are arranged at 15 µm spacing, to the electrode pattern.

A glass substrate having an Al film deposited on its one surface was then thermally bonded upon being pressed at a pressure of 10 g per electrode while being heated to 100° C. in a state where it was superimposed on the anisotropic conductive film such that the Al film would be brought into contact therewith.

A resistance value between the two adjacent Au electrodes which are conductively connected to each other through the anisotropic conductive film and the Al film was measured, and the measured resistance value was reduced by half to be a connecting resistance in the thickness direction of the anisotropic conductive film.

The results are shown in Table 1. Evaluations in Table 1 are respectively as follows:

⊚: The connecting resistance is not more than 0.1 Ω. The conductive properties in the thickness direction are significantly good.

○: The connecting resistance exceeds 0.1 Ω and is not more than 1 Ω. The conductive properties in the thickness direction are good.

×: The connecting resistance exceeds 1 Ω. The conductive properties in the thickness direction are bad.

Measurement of Insulating Resistance

The anisotropic conductive film produced in each of the examples and the comparative examples was affixed to the electrode pattern on the same FPC as that used in the foregoing.

A glass substrate having no Al film deposited thereon at this time was then thermally bonded upon being pressed at a pressure of 10 g per electrode while being heated to 100° C. in a state where it was superimposed on the anisotropic conductive film.

A resistance value between the two adjacent Au electrodes to which the glass substrate was thermally bonded through the anisotropic conductive film was measured to be an insulating resistance in the plane direction of the anisotropic conductive film.

The results are shown in Table 1. Evaluations in Table 1 are respectively as follows:

◎: The insulating resistance exceeds 1 GΩ. The insulating properties in the plane direction are significantly good.

○: The insulating resistance exceeds 1 MΩ and is not more than 1 GΩ. The insulating properties in the plane direction are good.

×: The insulating resistance is not more than 1 MΩ. The insulating properties in the plane direction are bad.

TABLE 1

|  | Connecting resistance measured value (evaluation) | Insulating resistance measured value (evaluation) |
| --- | --- | --- |
| Example 1 | 1 Ω(○) | 10 MΩ(○) |
| Example 2 | 0.5 Ω(○) | 10 GΩ(◎) |
| Example 3 | 0.1 Ω(◎) | 1 GΩ(○) |
| Example 4 | 0.05 Ω(◎) | 1 GΩ(○) |
| Example 5 | 0.05 Ω(◎) | 1 GΩ(○) |
| Comparative Example 1 | 1 Ω(○) | 100 Ω(X) |
| Comparative Example 2 | 1 Ω(○) | 1 KΩ(X) |
| Comparative Example 3 | 10 KΩ(X) | 1 GΩ(○) |

From Table 1, it was found that both the anisotropic conductive film in the comparative example 1 in which the flake-shaped Ni powder was contained at a filling factor of 20% by volume and the anisotropic conductive film in the comparative example 2 in which the spherical metal powder having a composite structure of the resin particles and the Au coating was contained at a filling factor of 20% by volume were low in insulating resistance and were inferior in insulating properties in the plane direction of the film. Further, it was found that the anisotropic conductive film in the comparative example 3 in which the filling factor of the spherical metal powder having the above-mentioned composite structure was decreased to 1% by volume was high in connecting resistance and was inferior in conductive properties in the thickness direction of the film.

On the other hand, it was found that all of the anisotropic conductive films in the examples 1 to 5 were low in connecting resistance, were superior in conductive properties in the thickness direction of the film, were high in insulating resistance, and were superior in insulating properties in the plane direction of the film.

From the examples 1 and 2, it was confirmed that in order to make the connecting resistance lower and make the insulating resistance higher, the filling factor of the metal powder in a straight-chain shape might be made lower while making the diameter of the chain of the metal powder larger.

It was confirmed that the surface of the chain of the metal powder might be coated with a metal superior in conductive properties in order to further reduce the connecting resistance from the examples 1 to 3, and the chain of the metal powder might be oriented in the thickness direction of the film from the examples 3 to 5.

Example 6

Used as a conductive component, an Ni powder, which has the form of fine Ni particles being linked in a straight-chain shape and in which the particle diameter of the Ni particles is 400 nm, the diameter D and the length L of the chain are respectively 1 μm and 9 μm, and the ratio L/D is 9.

The Ni powder and acrylic resin serving as a binding agent were mixed such that the filling factor of the Ni powder would be 1% by volume, and methyl ethyl ketone was added to a mixture, to prepare a paste-shaped composite material.

The composite material was then applied over a magnet serving as a base, was dried or solidified in a magnetic field with a magnetic flux density of 200000 μT and therefore, was fixed in a state where the metal powder was arranged in the thickness direction of the film, followed by stripping, to produce an anisotropic conductive film having a thickness of 20 μm.

Example 7

An anisotropic conductive film having a thickness of 20 μm was produced in the same manner as that in the example 6 except that an Ni powder, which has the form of fine Ni particles being linked in a straight-chain shape and in which the particle diameter of the Ni particles is 400 nm, the diameter D and the length L of the chain are respectively 3 μm and 9 μm, and the ratio L/D is 3, was used as a conductive component.

Comparative Example 4

An anisotropic conductive film having a thickness of 20 μm was produced in the same manner as that in the example 6 except that an Ni powder, which has the form of fine Ni particles being linked in a straight-chain shape and in which the particle diameter of the Ni particles is 400 nm, the diameter D and the length L of the chain are respectively 1 μm and 15 μm, and the ratio L/D is 15, was used as a conductive component.

Comparative Example 5

An anisotropic conductive film having a thickness of 20 μm was produced in the same manner as that in the example 6 except that a granular Ni powder, which is composed of an aggregate of fine Ni particles and in which the particle diameter of the Ni particles is 400 nm, the minor diameter D and the major diameter L are respectively 6 μm and 9 μm, and the ratio L/D is 1.5, was used as a conductive component.

Measurement of Connecting Resistance

The anisotropic conductive film produced in each of the examples and the comparative examples was affixed, on an FPC having an electrode pattern in which Au electrodes having a width of 15 μm, a length of 50 μm, and a thickness of 5 μm are arranged at 10 μm spacing, to the electrode pattern.

A glass substrate having an Al film deposited on its one surface was then thermally bonded upon being pressed at a pressure of 10 g per electrode while being heated to 100° C. in a state where it was superimposed on the anisotropic conductive film such that the Al film would be brought into contact therewith.

A resistance value between the two adjacent Au electrodes which are conductively connected to each other through the anisotropic conductive film and the Al film was measured, and the measured resistance value was reduced by half to be a connecting resistance in the thickness direction of the anisotropic conductive film.

The results are shown in Table 2. Evaluations in Table 2 are respectively as follows:

⊚: The connecting resistance is not more than 0.1 Ω. The conductive properties in the thickness direction are significantly good.

○: The connecting resistance exceeds 0.1 Ω and is not more than 1 Ω. The conductive properties in the thickness direction are good.

×: The connecting resistance exceeds 1 Ω. The conductive properties in the thickness direction are bad.

Measurement of Insulating Resistance

The anisotropic conductive film produced in each of the examples and the comparative examples was affixed to the electrode pattern on the same FPC as that used in the foregoing.

A glass substrate having no Al film deposited thereon at this time was thermally bonded upon being pressed at a pressure of 10 g per electrode while being heated to 100° C. in a state where it was superimposed on the anisotropic conductive film.

A resistance value between the two adjacent Au electrodes to which the glass substrate was thermally bonded through the anisotropic conductive film was measured to be an insulating resistance in the plane direction of the anisotropic conductive film.

The results are shown in Table 2. Evaluations in Table 2 are respectively as follows:

⊚: The insulating resistance exceeds 1 GΩ. The insulating properties in the plane direction are significantly good.

○: The insulating resistance exceeds 1 MΩ and is not more than 1 GΩ. The insulating properties in the plane direction are good.

×: The insulating resistance is not more than 1 MΩ. The insulating properties in the plane direction are bad.

TABLE 2

|  | Connecting resistance measured value (evaluation) | Insulating resistance measured value (evaluation) |
|---|---|---|
| Example 6 | 0.5 Ω(○) | 10 GΩ(⊚) |
| Example 7 | 1 Ω(○) | 15 GΩ(⊚) |
| Comparative Example 4 | 0.8 Ω(○) | 100 Ω(X) |
| Comparative Example 5 | 2.5 Ω(X) | 20 GΩ(⊚) |

From Table 2, it was found that the anisotropic conductive film in the comparative example 4 in which the chain-shaped Ni powder, in which the length of the chain is larger than the distance between the adjacent electrodes, is contained was low in insulating resistance and was inferior in insulating properties in the plane direction of the film. It was predicted as this cause that the Ni powder fell sideways at the time of thermal bonding to cause short circuit between the adjacent electrodes.

Furthermore, it was found that the anisotropic conductive film in the comparative example 5 containing the Ni powder having not a chain shape but a granular shape because the ratio L/D is too low was high in connecting resistance and was low in conductive properties in the thickness direction of the film.

On the other hand, it was found that both the anisotropic conductive films in the examples 6 and 7 were low in connecting resistance and were superior in conductive properties in the thickness direction of the film, and were high in insulating resistance and were superior in insulating properties in the plane direction of the film. This proved that even if the Ni powder fell sideways at the time of thermal bonding, short circuit between the adjacent electrodes could be reliably prevented by setting the length of the chain to less than the distance between the adjacent electrodes.

[Anisotropic Conductive Film for Mounting Contact Probe]

Example 8

Used as a conductive component was an Ni powder, which has the form of a plurality of chains, each having fine Ni particles linked in a straight-chain shape, aggregating in a bundle shape and in which the particle diameter of the Ni particles is 100 nm, the diameter D and the length L of the chain are respectively 10 μm and 50 μm, and the ratio L/D is 5.

The Ni powder and acrylic resin serving as a binding agent were mixed such that the filling factor of the Ni powder would be 1% by volume, and methyl ethyl ketone was added to a mixture, to prepare a paste-shaped composite material.

The composite material was then applied over a magnet serving as a base, was dried or solidified in a magnetic field with a magnetic flux density of 200000 μT and therefore, was fixed in a state where the metal powder was oriented in the thickness direction of the film, followed by stripping, to produce an anisotropic conductive film having a thickness of 120 μm.

Example 9

An anisotropic conductive film having a thickness of 120 μm was produced in the same manner as that in the example 8 except that an Ni powder, which has the form of fine Ni particles being linked in a straight-chain shape and in which the particle diameter of the Ni particles is 1 μm, the diameter D and the length L of the chain are respectively 10 μm and 50 μm, and the ratio L/D is 5, was used as a conductive component.

Example 10

An anisotropic conductive film having a thickness of 120 μm was produced in the same manner as that in the example 8 except that a metal powder having a composite structure in which a surface of an Ni powder, which has the form of fine Ni particles being linked in a straight-chain shape and in which the particle diameter of the Ni particles is 1 μm, the diameter D and the length L of the chain are respectively 10 μm and 50 μm, and the ratio L/D is 5, is coated with Ag having a thickness of 50 nm, was used as a conductive component.

Example 11

An anisotropic conductive film having a thickness of 120 μm was produced in the same manner as that in the example 8 except that an Ni powder, which has the form of fine Ni particles being linked in a straight-chain shape and in which the particle diameter of the Ni particles is 300 nm, the diameter D and the length L of the chain are respectively 600 nm and 50 μm, and the ratio L/D is 83.3, was used as a conductive component.

Comparative Example 6

A spherical Ni powder having a diameter of 5 μm was used as a conductive component, the Ni power and acrylic resin serving as a binding agent were mixed such that the filling factor of the Ni powder would be 10% by volume, and methyl ethyl ketone was added to a mixture, to prepare a paste-shaped composite material.

The composite material was then applied over a glass substrate, was dried or solidified, and was then stripped, to produce an anisotropic conductive film having a thickness of 120 μm.

Comparative Example 7

A metal powder in which a surface of the same spherical resin particles having a diameter of 5 μm as that used in the comparative example 2 is coated with Au having a thickness of 100 nm was used as a conductive component, the metal powder and acrylic resin serving as a binding agent were mixed such that the filling factor of the metal particles would be 10% by volume, and methyl ethyl ketone was added to a mixture, to prepare a paste-shaped composite material.

The composite material was then applied over a glass substrate, was dried or solidified, and was then stripped, to produce an anisotropic conductive film having a thickness of 120 μm.

Comparative Example 8

A commercially available anisotropic conductive film having a thickness of 120 μm, in which columnar Cu powders having a diameter of 20 μm and a length of 120 μm were distributed at 30 μm spacing in resin having insulating properties, was used as a comparative example 8.

Measurement of Connecting Resistance

The anisotropic conductive film produced in each of the examples and the comparative examples was affixed, on an FPC having an electrode pattern in which Au electrodes having a width of 100 μm, a length of 50 μm, and a thickness of 2 μm are arranged at 40 μm spacing, to the electrode pattern.

A glass substrate having an Al film deposited on its one surface was then thermally bonded upon being pressed at a pressure of 1 g per electrode while being heated to 100° C. in a state where it was superimposed on the anisotropic conductive film such that the Al film would be brought into contact therewith.

A resistance value between the two adjacent Au electrodes which are conductively connected to each other through the anisotropic conductive film and the Al film was measured, and the measured resistance value was reduced by half to be a connecting resistance in the thickness direction of the anisotropic conductive film.

The results are shown in Table 3. Evaluations in Table 3 are respectively as follows:

◎: The connecting resistance is not more than 0.1 Ω. The conductive properties in the thickness direction are significantly good.

○: The connecting resistance exceeds 0.1 Ω and is not more than 1 Ω. The conductive properties in the thickness direction are good.

×: The connecting resistance exceeds 1 Ω. The conductive properties in the thickness direction are bad.

Measurement of Insulating Resistance

The anisotropic conductive film produced in each of the examples and the comparative examples was affixed, on an FPC having an electrode pattern in which Au electrodes having a width of 100 μm, a length of 50 μm, and a thickness of 2 μm are arranged at 40 μm spacing, to the electrode pattern.

A glass substrate having no Al film deposited thereon at this time was then thermally bonded upon being pressed at a pressure of 1 g per electrode while being heated to 100° C. in a state where it was superimposed on the anisotropic conductive film.

A resistance value between the two adjacent Au electrodes to which the glass substrate was thermally bonded through the anisotropic conductive film was measured, to be an insulating resistance in the plane direction of the anisotropic conductive film.

The results are shown in Table 3. Evaluations in Table 3 are respectively as follows:

◎: The insulating resistance exceeds 10 GΩ. The insulating properties in the plane direction are significantly good.

○: The insulating resistance exceeds 100 MΩ and is not more than 10 GΩ. The insulating properties in the plane direction are good.

×: The insulating resistance is not more than 100 MΩ. The insulating properties in the plane direction are bad.

Measurement of Limiting Current Amount

The anisotropic conductive film produced in each of the examples and the comparative examples was affixed, on an FPC having an electrode pattern in which Au electrodes having a width of 100 μm, a length of 50 μm, and a thickness of 2 μm are arranged at 40 μm spacing, to the electrode pattern.

A glass substrate having an Al film deposited on its one surface was then thermally bonded upon being pressed at a pressure of 1 g per electrode while being heated to 100° C. in a state where it was superimposed on the anisotropic conductive film such that the Al film would be brought into contact therewith.

When a current was caused to flow between the two adjacent Au electrodes which are conductively connected to each other through the anisotropic conductive film and the Al film, and its current value was gradually increased, a current value at which disconnection due to fusing occurs was found as a limiting current amount.

The results are shown in Table 3. Evaluations in Table 3 are respectively as follows:

◎: The limiting current amount exceeds 1.5 A. The current resistance is significantly good.

○: The limiting current value is not less than 1.0 A and is not more than 1.5 A. The current resistance is good.

×: The limiting current value is less than 1.0 A. The current resistance is bad.

TABLE 3

|  | Connecting resistance measured value (evaluation) | Insulating resistance measured value (evaluation) | Limiting current measured value (evaluation) |
| --- | --- | --- | --- |
| Example 8 | 0.05 Ω(◎) | 10 GΩ(◎) | 1.5 A(○) |
| Example 9 | 0.05 Ω(◎) | 15 GΩ(◎) | 1.8 A(◎) |
| Example 10 | 0.01 Ω(◎) | 15 GΩ(◎) | 2.0 A(◎) |
| Example 11 | 0.05 Ω(◎) | 1 GΩ(○) | 1.0 A(○) |
| Comparative Example 6 | 1 MΩ(×) | 100 MΩ(×) | — |
| Comparative Example 7 | 1 GΩ(×) | 1 GΩ(○) | — |
| Comparative Example 8 | 100 Ω(×) | 15 GΩ(◎) | 2.0 A(◎) |

From Table 3, it was found that both the anisotropic conductive film in the comparative example 6 in which the spherical Ni powder was contained at a filling factor of 10% by volume and the anisotropic conductive film in the comparative example 7 in which the spherical metal powder having a composite structure of the resin particles and the Au coating was contained at a filling factor of 10% by volume were high in connecting resistance and were inferior in conductive properties in the thickness direction of the film. Further, it was also found that the anisotropic conductive film in the comparative example 6 was low in insulating resistance and therefore, was also inferior in insulating resistance in the plane direction of the film.

It was found that the anisotropic conductive film in the comparative example 8 containing the columnar Cu powder was still high in connecting resistance and was inferior in conductive properties in the thickness direction of the film.

On the other hand, it was found that all of the anisotropic conductive films in the examples 8 to 11 were low in connecting resistance and were superior in conductive properties in the thickness direction of the film, and were high in insulating resistance and were superior in insulating resistance in the plane direction of the film.

From the examples 8 to 10 and the example 11, it was confirmed that in order to improve the limiting current value of the anisotropic conductive film, the diameter of the chain of the metal powder was in a range exceeding 1 μm and particularly not less than 5 μm.

From the examples 8 and 9 and the example 10, it was confirmed that the surface of the chain of the metal powder might be coated with a metal superior in conductive properties in order to further reduce the connecting resistance.

The invention claimed is:

1. An anisotropic conductive film comprising:
   a chain comprising ferromagnetic particles directly linked to each other, the chain formed by magnetism, and
   a metal layer covering the chain of ferromagnetic particles, wherein the ratio of the length of the chain (L) to the diameter of the chain (D) is not less than 3.

2. The anisotropic conductive film according to claim 1, characterized in that the chain of ferromagnetic particles is oriented in the thickness direction of the film.

3. The anisotropic conductive film according to claim 1, characterized in that the ferromagnetic particles are selected from the group consisting of a metal having ferromagnetism, an alloy of two or more types of metals having ferromagnetism, an alloy of a metal having ferromagnetism and another metal, and a complex containing a metal having ferromagnetism.

4. The anisotropic conductive film according to claim 1, wherein the chain is a straight-chain shape or a needle shape.

5. The anisotropic conductive film according to claim 1, characterized in that the length of the chain of the ferromagnetic particles is less than the distance between adjacent electrodes, composing a connecting portion, conductively connected by using the anisotropic conductive film.

6. The anisotropic conductive film according to claim 5, characterized in that the diameter of the chain is not more than 1 μm.

7. The anisotropic conductive film according to claim 6, wherein the particle diameter of each of the ferromagnetic particles is not more than 400 nm.

8. The anisotropic conductive film according to claim 5, characterized in that the ferromagnetic particles are selected from the group consisting of a metal having ferromagnetism, an alloy of two or more types of metals having ferromagnetism, an alloy of a metal having ferromagnetism and another metal, and a complex containing a metal having ferromagnetism and at least one metal, and the metal layer covering the chain is selected from a group consisting of Cu, Rb, Rh, Pd, Ag, Re, Pt, and Au.

9. The anisotropic conductive film according to claim 2, characterized in that the diameter of the chain exceeds 1 μm and is not more than 20 μm.

10. The anisotropic conductive film according to claim 9, characterized in that the ferromagnetic particles are selected from the group consisting of a metal having ferromagnetism, an alloy of two or more types of metals having ferromagnetism, an alloy of a metal having ferromagnetism and another metal, and a complex containing a metal having ferromagnetism and at least one metal, and the metal layer covering the chain is selected from a group consisting of Cu, Rb, Rh, Pd, Ag, Re, Pt, and Au.

11. An anisotropic conductive film comprising:
    a chain of particles formed by magnetism, each particle comprising ferromagnetic core and a first metal layer covering the ferromagnetic core, and
    a second metal layer covering the chain of particles,
    wherein the ratio of the length of the chain (L) to the diameter of the chain (D) is not less than 3.

12. The anisotropic conductive film according to claim 11, characterized in that the chain of particles is oriented in the thickness direction of the film.

13. The anisotropic conductive film according to claim 11, characterized in that the chain of particles are selected from the group consisting of a metal having ferromagnetism, an alloy of two or more types of metals having ferromagnetism, an alloy of a metal having ferromagnetism and another metal, and a complex containing a metal having ferromagnetism.

14. The anisotropic conductive film according to claim 11, wherein the chain is a straight-chain shape or a needle shape.

15. The anisotropic conductive film according to claim 11, wherein the length of the chain of particles is less than the distance between adjacent electrodes, composing a connecting portion, conductively connected by using the anisotropic conductive film.

16. The anisotropic conductive film according to claim 15, characterized in that the diameter of the chain is not more than 1 μm.

17. The anisotropic conductive film according to claim 16, wherein the diameter of each of the particles is not more than 400 nm.

18. The anisotropic conductive film according to claim 15, characterized in that the particles are selected from the group consisting of a metal having ferromagnetism, an alloy of two or more types of metals having ferromagnetism, an alloy of a metal having ferromagnetism and another metal, and a complex containing a metal having ferromagnetism and at least one metal, and the second metal layer covering the chain is selected from a group consisting of Cu, Rb, Rh, Pd, Ag, Re, Pt, and Au.

19. The anisotropic conductive film according to claim 12, characterized in that the diameter of the chain exceeds 1 μm and is not more than 20 μm.

20. The anisotropic conductive film according to claim 19, characterized in that the particles are selected from the group consisting of a metal having ferromagnetism, an alloy of two or more types of metals having ferromagnetism, an alloy of a metal having ferromagnetism and another metal, and a complex containing a metal having ferromagnetism and at least one metal, and the second metal layer covering the chain is selected from a group consisting of Cu, Rb, Rh, Pd, Ag, Re, Pt, and Au.

21. A method of producing an anisotropic conductive film comprising:

applying a composite material in a binder to a base to form a film, said composite material comprising a chain of ferromagnetic particles directly linked to each other, the chain formed by magnetism, and a metal layer covering the chain of ferromagnetic particles, wherein the ratio of the length of the chain (L) to the diameter of the chain (D) is not less than 3;

applying a magnetic filed in a direction crossing a surface of the base to orient the composite material in the thickness direction of the film along the direction of the magnetic field; and curing the binding agent to fix the orientation of the composite material.

22. The method according to claim 21, wherein the whole or a part composite material is formed by depositing in a solution containing one type or two or more types of metal ions having ferromagnetism by reducing the ions using a reducing agent in the solution.

23. The method according to claim 22, wherein the reducing agent is a trivalent titanium compound.

24. The method according to claim 21, wherein the ratio of the amount of the composite material to the total amount of composite material and binder is 0.05 to 20% by volume.

25. The method according to claim 24, wherein the ratio is 0.05 to 5% by volume.

26. The method according to claim 21, wherein the composite material and binder are sprayed onto the base.

27. A method of producing an anisotropic conductive film comprising:

applying a composite material in a binder to a base to form a film, said composite material comprising a chain of particles formed by magnetism, each particle comprising ferromagnetic core and a first metal layer covering the ferromagnetic core, and a second metal layer covering the chain of particles;

applying a magnetic filed in a direction crossing a surface of the base to orient the composite material in the thickness direction of the film along the direction of the magnetic field; and curing the binding agent to fix the orientation of the composite material.

28. The method according to claim 27, wherein the whole or a part of the chain of ferromagnetic particles is formed by depositing in a solution containing one type or two or more types of metal ions having ferromagnetism by reducing the ions to a metal using a reducing agent in the solution.

29. The method according to claim 28, wherein the reducing agent is a trivalent titanium compound.

30. The method according to claim 27, wherein the ratio of the amount of the composite material to the total amount of composite material and binder is 0.05 to 20% by volume.

31. The method according to claim 30, wherein the ratio is 0.05 to 5% by volume.

32. The method according to claim 27, wherein the composite material and binder are sprayed onto the base.

* * * * *